(12) United States Patent
Zeng et al.

(10) Patent No.: US 11,355,448 B2
(45) Date of Patent: Jun. 7, 2022

(54) METHOD FOR MAKING ALUMINUM NITRIDE WAFER AND ALUMINUM NITRIDE WAFER MADE BY THE SAME

(71) Applicant: Hong Chuang Applied Technology Co., Ltd, Zhubei (TW)

(72) Inventors: Yan-Kai Zeng, Zhubei (TW); Bai-Xuan Jiang, Zhubei (TW)

(73) Assignee: HONG CHUANG APPLIED TECHNOLOGY CO., LTD, Zhubei (TW)

(*) Notice: Subject to any disclaimer, the term of this patent is extended or adjusted under 35 U.S.C. 154(b) by 78 days.

(21) Appl. No.: 16/922,127

(22) Filed: Jul. 7, 2020

(65) Prior Publication Data

US 2021/0287996 A1 Sep. 16, 2021

(30) Foreign Application Priority Data

Mar. 13, 2020 (TW) .................. 109108408

(51) Int. Cl.
| | | |
|---|---|---|
| *H01L 23/544* | (2006.01) | |
| *H01L 21/02* | (2006.01) | |
| *B24B 37/04* | (2012.01) | |
| *H01L 29/20* | (2006.01) | |

(52) U.S. Cl.
CPC ............ *H01L 23/544* (2013.01); *B24B 37/04* (2013.01); *H01L 21/02013* (2013.01); *H01L 29/2003* (2013.01); *H01L 2223/54426* (2013.01); *H01L 2223/54493* (2013.01)

(58) Field of Classification Search
CPC ............ H01L 23/544; H01L 21/02013; H01L 29/2003; H01L 2223/54426; H01L 2223/54493; H01L 21/02005; H01L 21/02021; H01L 21/02035; H01L 21/02024; H01L 21/02389; B24B 37/04; C04B 41/53; C04B 35/581; C04B 35/6455; C04B 2235/602; C04B 2235/658; C04B 2235/945; C04B 2235/6025

See application file for complete search history.

(56) References Cited

U.S. PATENT DOCUMENTS 8,389,099 B1 * 3/2013 Matthews ......... H01L 21/02013
428/66.7

* cited by examiner

*Primary Examiner* — Cuong B Nguyen
(74) *Attorney, Agent, or Firm* — Muncy, Geissler, Olds & Lowe, P.C.

(57) ABSTRACT

The present invention provides an aluminum nitride wafer and a method for making the same. The method includes forming at least one alignment notch in or at least one flat alignment edge on a periphery of the aluminum nitride wafer. The alignment notch and the flat alignment edge can prevent the aluminum nitride wafer from being in a poor state during the semiconductor manufacturing process and makes it possible to position the aluminum nitride wafer precisely so that the fraction defective can be lowered. The aluminum nitride wafer of the present invention has advantages of effective insulation, efficient heat dissipation, and a high dielectric constant, and can be used in semiconductor manufacturing processes, electronic products, and semiconductor equipment.

17 Claims, 5 Drawing Sheets

METHOD FOR MAKING ALUMINUM NITRIDE WAFER AND ALUMINUM NITRIDE WAFER MADE BY THE SAME

BACKGROUND OF THE INVENTION

1. Technical Field

The present invention relates to an aluminum nitride wafer and a method for making the same. More particularly, the present invention relates to an aluminum nitride wafer that has an alignment notch, a flat alignment edge, or a chamfered periphery and can be used in a semiconductor manufacturing process to make semiconductor electronic products.

2. Description of Related Art

Silicon wafers are generally made by melting high-purity silicon, dipping a seed crystal into the melt, pulling the seed crystal from the melt in a controlled manner to form a cylindrical monocrystalline ingot, slicing the ingot, and lapping and polishing the slices obtained. The resulting wafers can be processed in many ways, e.g., chemically, mechanically, or in a chemical mechanical manner. Chemical processing includes etching with an acid or alkali. Mechanical processing includes lapping and polishing. Chemical mechanical processing includes etching the silicon wafer surface with a strong acid or alkali to form a thin and soft oxidized layer and then polishing the etched surface mechanically.

Lapping is intended to reduce the thickness of a wafer to an acceptable range, and polishing is intended to correct the flaws caused by lapping and produce a flat, level, and planar wafer surface. The objective being to make the wafer surface smooth enough is to prevent external particles from attaching thereto, now that most wafer defects are attributable to particles, residues, or scratches on, or crystal-originated pits in, the wafer surface.

As stated above, wafers are cut from a wafer ingot (typically with a blade or a wire saw) and then lapped to the desired thickness. A wafer that is too thick may have problem dissipating heat efficiently. A power divider generally uses a wafer whose thickness is about 350 to 450 μm, whereas an integrated circuit requires a thinner wafer that is usually less than 180 μm thick.

BRIEF SUMMARY OF THE INVENTION

It is well known in the art that ceramic has a high dielectric constant, good insulating properties, high thermal conductivity, high resistance to heat, desirable heat-dissipation properties, and in particular, high stability under high humidity. Moreover, the inventor of the present invention has found through an extensive study that, of all the ceramic materials, polycrystalline aluminum nitride has a particularly high thermal conductivity (about 170 to 240 W/mk, which is seven to nine times as high as that of aluminum oxide), is resistant to corrosion and high heat, features a low coefficient of thermal expansion, a high dielectric constant, and high mechanical strength, and is therefore suitable for use as a wafer material, hopefully better than silicon. Thus, the present invention provides a method for making an aluminum nitride wafer and an aluminum nitride wafer made by the same. Aside from being made of aluminum nitride, the aluminum nitride wafer of the present invention is provided with an alignment notch or a flat alignment edge to effectively address such prior art issues as poor alignment, wafer breakage, or scratching during the processing process.

The objective of the present invention is to provide a method for making an aluminum nitride wafer, comprising the steps of: (a) subjecting an aluminum nitride green-body block to a high-temperature treatment and thereby turning the aluminum nitride green-body block into an aluminum nitride wafer block; (b) forming at least one alignment notch in or at least one flat alignment edge on a periphery of the aluminum nitride wafer block, and cutting the aluminum nitride wafer block into a plurality of aluminum nitride wafer slices; and (c) lapping and polishing each of the aluminum nitride wafer slice.

In a preferred embodiment, the aluminum nitride green-body block is obtained by placing an aluminum nitride green body into a mold, shaping the aluminum nitride green body in a mechanical or hydraulic manner, and performing an isostatic pressing process with water pressure, oil pressure, or gas pressure; wherein, the mechanical or hydraulic molding is performed at a molding force of 98066.50 to 9806650.00 N, the pressure in the mold is −0.063 to 100 atm, and the water, oil, or gas pressure-based isostatic pressing process uses a pressure of 100 to 8000 atm and a temperature of 10° C. to 100° C.

Another objective of the present invention is to provide a method for making an aluminum nitride wafer, comprising the steps of: (a) providing an aluminum nitride green-body slice, which can be obtained either by subjecting an aluminum nitride green body to a tape-casting process, or by first subjecting the aluminum nitride green body to a tape-casting process to form an aluminum nitride green-body roll and then cutting the aluminum nitride green-body roll; (b) subjecting the aluminum nitride green-body slice to a high temperature such that the aluminum nitride green-body slice is turned into an aluminum nitride wafer slice; and (c) forming at least one alignment notch in or at least one flat alignment edge on a periphery of the aluminum nitride wafer slice, and then lapping and polishing the aluminum nitride wafer slice.

In a preferred embodiment, the high-temperature treatment includes a debinding process and a sintering process; wherein, the debinding process is performed at a temperature of 200° C. to 900° C. in an environment that contains hydrogen, nitrogen, oxygen, argon, or air; and the sintering process is conducted at a temperature of 1000° C. to 3000° C. under a vacuum-pressure, atmospheric-pressure, or a high-pressure, and in an environment that contains hydrogen, nitrogen, or argon.

In a preferred embodiment, the aluminum nitride green body includes aluminum nitride granules; wherein, the aluminum nitride granules are obtained by mixing aluminum oxide and/or pure aluminum powder with an organic adhesive that contains nitrogen, carbon, and hydrogen atoms; subjecting the mixture to high-temperature carbothermic reduction in a gaseous environment containing nitrogen, carbon, and hydrogen atoms; performing high-temperature decarbonization in a nitrogen atmosphere, an oxygen atmosphere, or an atmospheric gaseous environment; and performing granulation.

In a preferred embodiment, the high-temperature carbothermic reduction is completed at a temperature of 600° C. to 3000° C.

In a preferred embodiment, the step (c) further includes chamfering the periphery of the aluminum nitride wafer slice before or after the aluminum nitride wafer slice is lapped and polished; wherein, a shape of a chamfered periphery includes a rectangular shape, a semicircular shape, an asymmetric semicircular shape, a semielliptical shape, an asymmetric semielliptical shape, a symmetric trapezoidal shape, an asymmetric trapezoidal shape, a shape incorporating a semicircle into a symmetric trapezoid, and a shape incorporating a semicircle into an asymmetric trapezoid.

In a preferred embodiment, the alignment notch is a V-shaped groove, and its pointed V-shaped bottom as well as its left and right upper portions are curved.

In a preferred embodiment, the flat alignment edge is formed by laser, a water jet cutter, or mechanical processing.

Still another objective of the present invention is to provide an aluminum nitride wafer obtained using the above method, wherein a periphery of the aluminum nitride wafer includes at least one alignment notch or at least one flat alignment edge.

Comparing to the conventional technique, the method disclosed herein for making an aluminum nitride wafer can produce an aluminum nitride wafer that not only is resistant to corrosion and high heat, but also has a low coefficient of thermal expansion, a high dielectric constant, and high mechanical strength. The aluminum nitride wafer of the present invention has an alignment notch or a flat alignment edge for preventing problems associated with poor alignment, such as excessively oblique slicing, failure to achieve a flat and even wafer surface by lapping and polishing, and a high fraction defective.

DETAILED DESCRIPTION OF THE INVENTION

The following embodiments should not be considered as excessively limiting the present invention. Those with ordinary knowledge in the technical field to which the present invention belongs can modify and change the embodiments discussed herein without departing from the spirit or scope of the present invention, and the variation and modification may still fall into the scope of the present invention.

According to the first embodiment the present invention, a method for making an aluminum nitride wafer includes the steps of: (a) subjecting an aluminum nitride green-body block to a high-temperature treatment and thereby turning the aluminum nitride green-body block into an aluminum nitride wafer block; (b) forming at least one alignment notch in or at least one flat alignment edge on a periphery of the aluminum nitride wafer block, and cutting the aluminum nitride wafer block into a plurality of aluminum nitride wafer slices; and (c) lapping and polishing each of the aluminum nitride wafer slice.

In the first embodiment the present invention, the "aluminum nitride green-body block" is obtained by placing an aluminum nitride green body into a mold, shaping the aluminum nitride green body in a mechanical or hydraulic manner, and performing an isostatic pressing process with water pressure, oil pressure, or gas pressure, wherein the isostatic pressing process is preferably isotropic. Placing the aluminum nitride green body into a mold and shaping the aluminum nitride green body mechanically or hydraulically under a vacuum-pressure, atmospheric-pressure, or a high pressure helps reduce the pores in the resulting aluminum nitride wafers and prevent external particles from attaching to the surface of the resulting aluminum nitride wafers. The water, oil, or gas pressure-based isostatic pressing process allows the compacted aluminum nitride green body to have a uniform green density, i.e., be homogeneous. The aluminum nitride green body in the mold is mechanically or hydraulically shaped under a molding force of 98066.50 to 9806650.00 N (i.e., 10 to 1000 ton), such as but not limited to 98066.50 N, 4900332.50 N, 980665.00 N, 1961330.00 N, 2941995.00 N, 3922660.00 N, 4903325.00 N, 5883990.00 N, 6864655.00 N, 7845320.00 N, 8825985.00 N, or 9806650.00 N. The pressure in the mold may be a vacuum-pressure, atmospheric-pressure, or a high-pressure, ranging from −0.063 to 100 atm, such as but not limited to −0.063 atm, 1 atm, 5 atm, 10 atm, 20 atm, 30 atm, 40 atm, 50 atm, 60 atm, 70 atm, 80 atm, 90 atm, or 100 atm. The water, oil, or gas pressure-based isostatic pressing process, on the other hand, uses a pressure of 100 to 8000 atm and a temperature of 10° C. to 100° C., wherein the pressure may be, but is not limited to, 100 atm, 200 atm, 300 atm, 400 atm, 500 atm, 600 atm, 700 atm, 800 atm, 900 atm, 1000 atm, 1500 atm, 2000 atm, 2500 atm, 3000 atm, 3500 atm, 4000 atm, 4500 atm, 5000 atm, 5500 atm, 6000 atm, 6500 atm, 7000 atm, 7500 atm, or 8000 atm, and the temperature may be, but is not limited to, 10° C., 20° C., 30° C., 40° C., 50° C., 60° C., 70° C., 80° C., 90° C., or 100° C.

In step (b) of the first embodiment of the present invention, cutting the aluminum nitride wafer block into a plurality of aluminum nitride wafer slices can be carried out using a common wafer ingot cutting method, such as a blade or wire-based cutting method. For example, a diamond blade may be used for blade-based cutting, and a piano wire for wire-based cutting; the present invention has no limitation in this regard.

According to the second embodiment the present invention, a method for making an aluminum nitride wafer includes the steps of: (a) providing an aluminum nitride green-body slice, which can be obtained either by subjecting an aluminum nitride green body to a tape-casting process, or by first subjecting the aluminum nitride green body to a tape-casting process to form an aluminum nitride green-body roll and then cutting the aluminum nitride green-body roll; (b) subjecting the aluminum nitride green-body slice to a high-temperature treatment such that the aluminum nitride green-body slice is turned into an aluminum nitride wafer slice; and (c) forming at least one alignment notch in or at least one flat alignment edge on the periphery of the aluminum nitride wafer slice, and then lapping and polishing the aluminum nitride wafer slice.

In the present invention, the "aluminum nitride green body" is obtained by mixing aluminum nitride granules with a binding resin and/or a dispersant. Preferably, the aluminum nitride green body may be added with other additives, such as but not limited to a plasticizer, which endows the resulting aluminum nitride wafers with flexibility.

In the present invention, the "binding resin" may include any one or a combination of polyvinyl butyral (PVB), polyvinyl alcohol (PVA), polyethylene glycol (PEG), ethyl cellulose, polyacrylate, a lower alkyl acrylate copolymer, and a methacrylate. The binding resin may make up 0.1% to 10% by weight of the aluminum nitride green body, such as but not limited to 0.1 wt %, 1 wt %, 3 wt %, 5 wt %, 7 wt %, or 10 wt %.

In the present invention, the "dispersant" may include any one or a combination of the following organic solvents: an alcohol (e.g., methanol, ethanol (95%), n-butyl alcohol, amyl alcohol, toluene-ethanol (95%), or diacetone alcohol), a ketone (e.g., acetone, ethyl methyl ketone, a pentanone, methyl isobutyl ketone, or cyclohexanone), an ester (e.g., methyl acetate, ethyl acetate (85%), butyl acetate, isoamyl acetate, or tributyl phosphate), a carboxylic acid (e.g., acetic acid), a halogen-substituted hydrocarbon (e.g., carbon tetrachloride or propylene dichloride), toluene, 1,4-dioxane, a methyl cellosolve, and an ethyl cellosolve; the present invention has no limitation in this regard.

In the present invention, the "aluminum nitride granules" are obtained by mixing aluminum oxide and/or pure aluminum powder with an organic adhesive that contains nitrogen, carbon, and hydrogen atoms; subjecting the mixture to high-temperature carbothermic reduction in a vacuum-pressure, atmospheric-pressure, or high-pressure gaseous environment containing nitrogen, carbon, and hydrogen atoms (in which the carbon source may be a solid, a gas, or atoms); performing high-temperature decarbonization in a nitrogen atmosphere, an oxygen atmosphere, or an atmospheric gaseous environment; and performing granulation. During the "high-temperature carbothermic reduction", oxygen atoms of the aluminum oxide react with carbon atoms to form carbon monoxide or carbon dioxide, and the oxygen-atom vacancies are substituted or loaded with nitrogen atoms such that aluminum nitride is formed. The high-temperature carbothermic reduction takes place in a hydrogen, nitrogen, and carbon-containing gaseous environment in which the pressure may range from −0.063 to 6000 atm and the temperature from 600° C. to 3000° C.; for example, the pressure may be, but is not limited to, −0.063 atm, 1 atm, 100 atm, 500 atm, 1000 atm, 1500 atm, 2000 atm, 3000 atm, 4000 atm, 5000 atm, or 6000 atm, and the temperature may be, but is not limited to, 600° C., 700° C., 800° C., 900° C., 1000° C., 1100° C., 1200° C., 1600° C., 2000° C., 2100° C., 2200° C., 2300° C., 2400° C., 2500° C., 2600° C., 2700° C., 2800° C., 2900° C., or 3000° C. The "high-temperature decarbonization" is carried out at a temperature of 200° C. to 900° C., such as but not limited to 200° C., 300° C., 400° C., 500° C., 600° C., 700° C., 800° C., or 900° C., so as to remove the unwanted carbon or carbides that may be generated during the high-temperature carbothermic reduction. The resulting aluminum nitride granules have particle sizes ranging from 10 nm to 200 μm, such as but not limited to 10 nm, 20 nm, 30 nm, 40 nm, 50 nm, 60 nm, 70 nm, 80 nm, 90 nm, 100 nm, 150 nm, 200 nm, 250 nm, 300 nm, 350 nm, 400 nm, 450 nm, 500 nm, 550 nm, 600 nm, 650 nm, 700 nm, 750 nm, 800 nm, 850 nm, 900 nm, 1 μm, 10 μm, 20 μm, 30 μm, 40 μm, 50 μm, 60 μm, 70 μm, 80 μm, 90 μm, 100 μm, 110 μm, 120 μm, 130 μm, 140 μm, 150 μm, 160 μm, 170 μm, 180 μm, 190 μm, or 200 μm.

The "granulation" process may include the addition of a sintering aid and/or a binder and a dispersant, if necessary. The granulation method may involve pulverization, atomization, spraying, stirring and rolling/mixing, pressure forming, or sintering; preferably pulverization, atomization, or spraying; and more preferably pulverization. The sintering aid may include an oxide (e.g., any one or a combination of magnesium oxide, zirconia, calcium oxide, a rhenium oxide, yttrium oxide, silica, boron, and carbon) or a nitride (e.g., either one or a combination of aluminum nitride and boron nitride). The sintering aid may further include a metal such as cerium, europium, erbium, neodymium, terbium, samarium, thulium, dysprosium, yttrium, gadolinium, praseodymium, lutetium, holmium, promethium, lanthanum, or ytterbium. The sintering aid may constitute 0% to 20% by weight of the aluminum nitride granules, such as but not limited to 0 wt %, 0.5 wt %, 1 wt %, 1.5 wt %, 2 wt %, 5 wt %, 10 wt %, 15 wt %, or 20 wt %. The binder may include any one or a combination of PVB, PEG, gum arabic, ammonium alginate, methyl cellulose, methylene cellulose, ethyl cellulose, hydroxyethyl cellulose, methacrylamide, N,N'-methylene bisacrylamide, and polyoxyethylene. The binder may constitute 0.1% to 20% by weight of the aluminum nitride granules, such as but not limited to 0.1 wt %, 1 wt %, 3 wt %, 5 wt %, 7 wt %, 10 wt %, 15 wt %, or 20 wt %. The dispersant may include any one or a combination of polyacrylic acid, polypropylene, polyacrylamide, polyethylene, polyvinylidene, PEG, gum arabic, gelatin, fish oil, flying fish oil, oleic acid, and castor oil. The dispersant may constitute 0.1% to 20% by weight of the aluminum nitride granules, such as but not limited to 0.1 wt %, 1 wt %, 2 wt %, 3 wt %, 4 wt %, 5 wt %, 10 wt %, 15 wt %, or 20 wt %.

In the present invention, the "organic adhesive that contains nitrogen, carbon, and hydrogen atoms" may include any one or a combination of phenol-formaldehyde resin, polyacrylonitrile, acrylonitrile-butadiene-styrene (ABS) resin, styrene-butadiene rubber, and carbon powder, preferably phenol-formaldehyde resin.

In the present invention, "high-temperature treatment" includes a debinding process and a sintering process. The "debinding process" aims to remove the organic matter in the aluminum nitride green body by heating or other physical means, and may use such conventional debinding methods as thermal debinding, solvent debinding, catalytic debinding, or water-based extraction debinding, preferably thermal debinding performed at a temperature of 200° C. to 900° C., such as but not limited to 200° C., 250° C., 300° C., 350° C., 400° C., 450° C., 500° C., 550° C., 600° C., 650° C., 700° C., 750° C., 800° C., 850° C., or 900° C., in an environment that contains hydrogen, nitrogen, oxygen, argon, or air. The debinding step is intended to remove the binder in the aluminum nitride granules. The "sintering process" is conducted at a high temperature; under a vacuum-pressure, atmospheric-pressure, or a high-pressure; and in an environment that contains hydrogen, nitrogen, or argon, wherein the high temperature may range from 1000° C. to 3000° C., such as but not limited to 1000° C., 1200° C., 1500° C., 2000° C., 2500° C., or 3000° C., and the vacuum-pressure, atmospheric-pressure, or a high-pressure may range from −0.063 atm to 6000 atm, such as but not limited to −0.063 atm, 0 atm, 1 atm, 100 atm, 500 atm, 1000 atm, 1500 atm, 2000 atm, 3000 atm, 4000 atm, 5000 atm, or 6000 atm.

Figure 1:
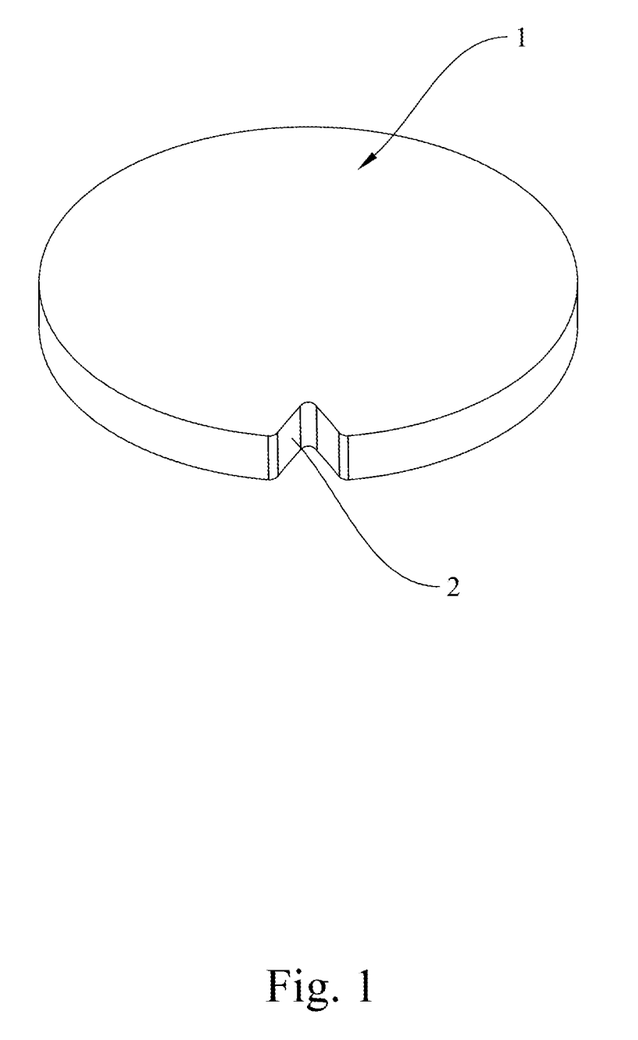
FIG. 1 is a schematic view of the aluminum nitride wafer of the present invention without a chamfered periphery.
Figure 2:
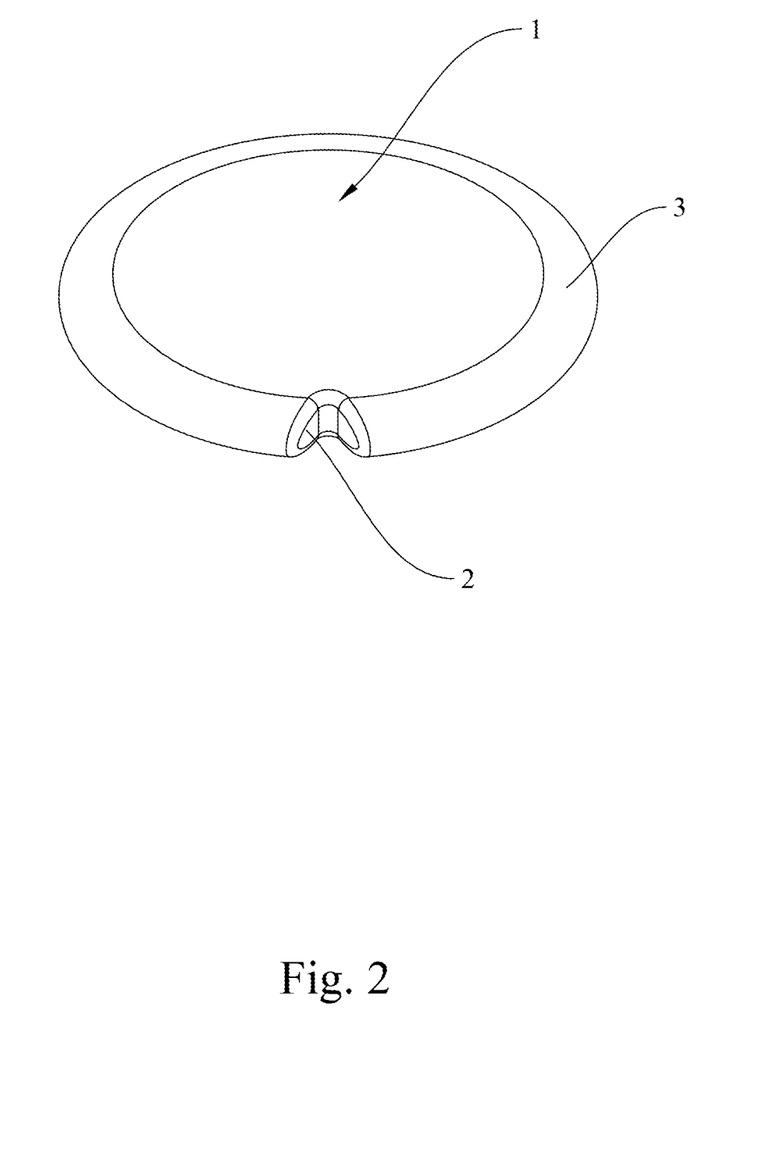
FIG. 2 is a schematic view of the aluminum nitride wafer of the present invention having a chamfered periphery and an alignment notch that is a V-shaped groove, wherein the pointed V-shaped bottom and the left and right upper portions are curved.

In the present invention, step (c) may further include chamfering the periphery of each/the aluminum nitride wafer slice before or after the aluminum nitride wafer slice is lapped and polished. FIG. 1 shows an aluminum nitride wafer 1 that is made according to the present invention without chamfering, while FIG. 2 shows an aluminum nitride wafer 1 that is made according to the present invention and is peripherally chamfered.

Figure 3:
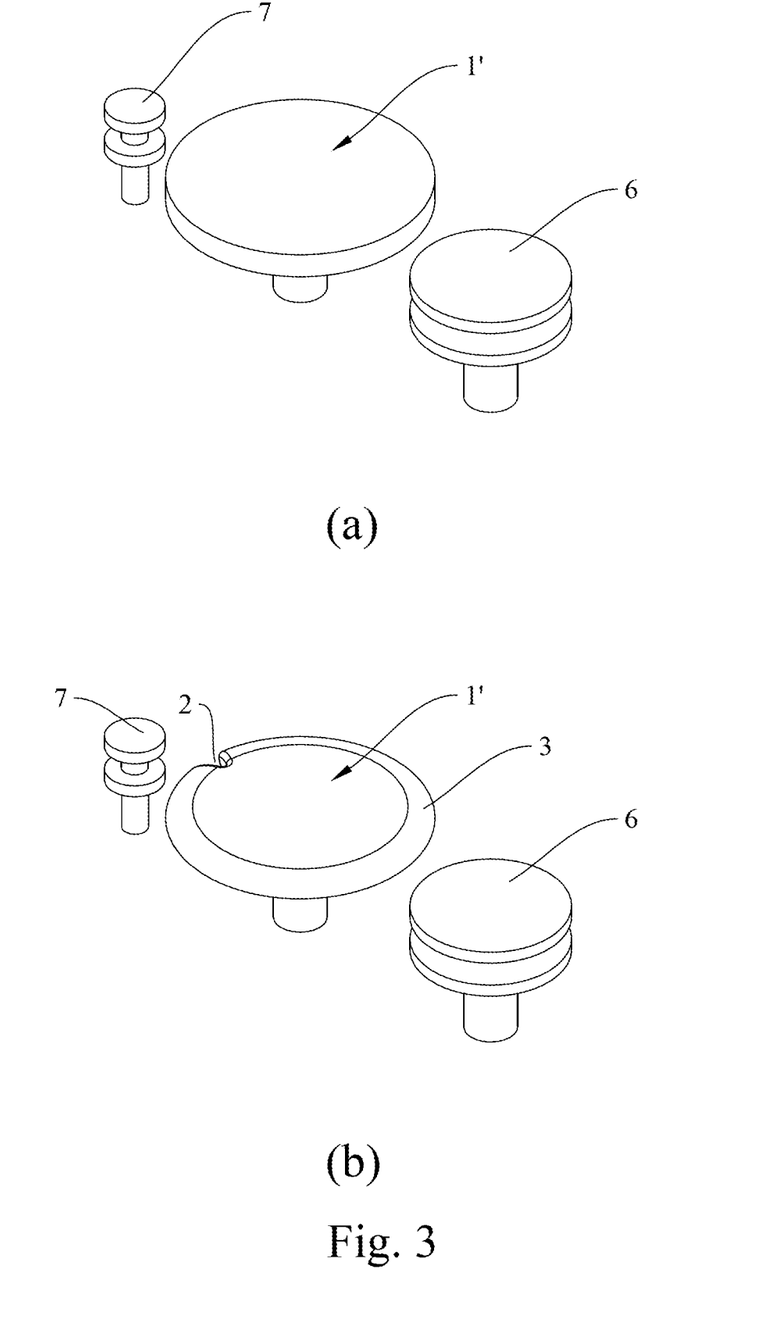
FIG. 3 is a schematic view showing a method for chamfering and forming an alignment notch in a periphery of an aluminum nitride wafer of the present invention.
Figure 4:
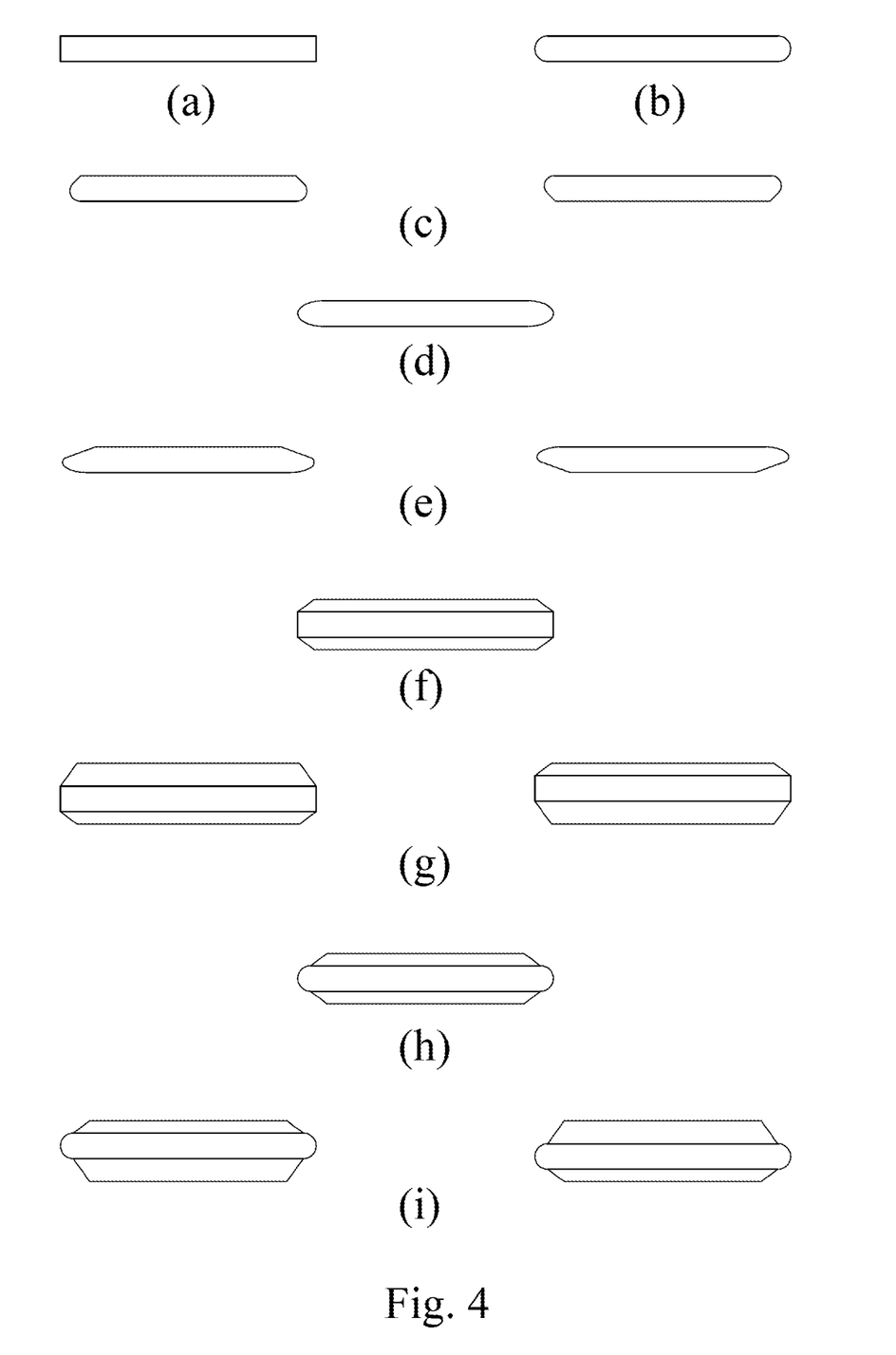
FIG. 4 shows various shapes of the chamfered periphery of the aluminum nitride wafer of the present invention: (a) a rectangular shape, (b) a semicircular shape, (c) an asymmetric semicircular shape, (d) a semielliptical shape, (e) an asymmetric semielliptical shape, (f) a symmetric trapezoidal shape, (g) an asymmetric trapezoidal shape, (h) a shape incorporating a semicircle into a symmetric trapezoid, and (i) a shape incorporating a semicircle into an asymmetric trapezoid.

In the present invention, "chamfering" refers to imparting a particular shape to the periphery of an aluminum nitride wafer slice, and this can be carried out with a common edge grinder or computer numerical control (CNC) machine, such as a grinding wheel configured to form that particular shape. In FIG. 3(a) and FIG. 3(b) for example, the aluminum nitride wafer slice 1' is ground with a chamfering grinding wheel 6 in order to have a semicircular chamfered periphery 3. Referring to FIG. 4(a) to FIG. 4(i), a chamfered periphery may assume various shapes, including but not limited to: (a) a rectangular shape, (b) a semicircular shape, (c) an asymmetric semicircular shape, (d) a semielliptical shape, (e) an asymmetric semielliptical shape, (f) a symmetric trapezoidal shape, (g) an asymmetric trapezoidal shape, (h) a shape incorporating a semicircle into a symmetric trapezoid, and (i) a shape incorporating a semicircle into an asymmetric trapezoid. The chamfering step not only helps prevent stress concentration during manufacture, the formation of burrs, and break-up of the wafer periphery, but also contributes to the flatness required for the subsequent formation of a photoresist layer or epitaxial layer, allowing such a layer to be distributed evenly over the wafer surface, although certain special manufacturing processes may dispense with the chamfering step.

Figure 5:
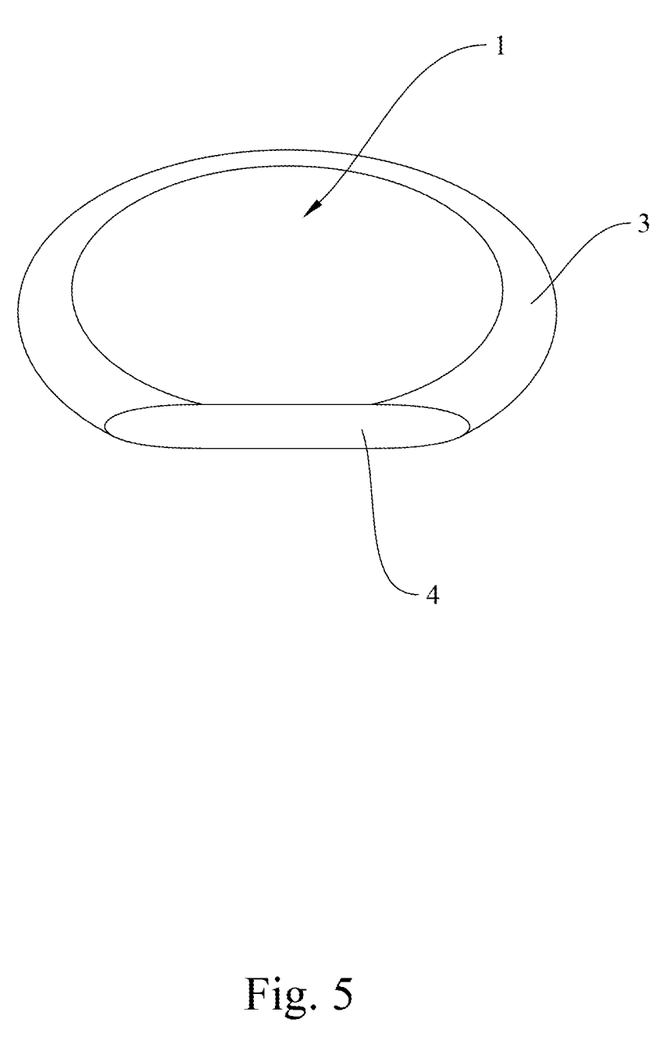
FIG. 5 is a schematic view of an aluminum nitride wafer of the present invention having a flat alignment edge.

In the present invention, the at least one "alignment notch or flat alignment edge" is at least one mark that is provided in/on the periphery of an aluminum nitride wafer slice and has a particular shape. As shown in FIG. 2, the alignment notch 2 may be a V-shaped groove, and all the pointed/sharp corners of the V-shaped groove (i.e., the pointed V-shaped bottom and the left and right upper portions) may be curved, lest the wafer break due to stress concentration. The flat alignment edge 4 shown in FIG. 5 is a planar edge. The alignment notch can be formed by a grinding wheel; for example, referring back to FIG. 3(a) and FIG. 3(b), the alignment notch 2 in the periphery of the aluminum nitride wafer slice 1' is formed by a grinding wheel 7 that is configured to form the notch. The flat alignment edge, on the other hand, can be formed by a common cutter for cutting the periphery of a wafer, wherein the cutting method may involve laser, a water jet cutter, or mechanical processing, without limitation. The alignment notch or the flat alignment edge makes it possible to position an aluminum nitride wafer precisely during manufacture so that the fraction defective can be lowered.

In the present invention, "lapping" may be a dry or wet grinding process performed in a unidirectional or bi-directional manner. When unidirectional grinding is used, the back of an aluminum nitride wafer slice to be lapped can be pasted with an ultraviolet light (UV)-curable adhesive, a hot melt adhesive, or other adhesive to enhance the uniformity of lapping.

In the present invention, "polishing" may be a dry or wet polishing process performed on one side or both sides of a aluminum nitride wafer slice.

An aluminum nitride wafer made according to the present invention has a thermal conductivity of 100 to 250 W/mk, such as 100 W/mk, 110 W/mk, 120 W/mk, 130 W/mk, 140 W/mk, 150 W/mk, 160 W/mk, 170 W/mk, 180 W/mk, 190 W/mk, 200 W/mk, 210 W/mk, 220 W/mk, 230 W/mk, 240 W/mk, or 250 W/mk, and can therefore dissipate heat easily without undergoing thermal expansion. In addition, an aluminum nitride wafer made according to the present invention has a dielectric constant of 8 to 9 (at 1 MHz), such as 8 (at 1 MHz), 8.1 (at 1 MHz), 8.2 (at 1 MHz), 8.3 (at 1 MHz), 8.4 (at 1 MHz), 8.5 (at 1 MHz), 8.6 (at 1 MHz), 8.7 (at 1 MHz), 8.8 (at 1 MHz), 8.9 (at 1 MHz), or 9 (at 1 MHz), and can therefore provide insulation. Furthermore, an aluminum nitride wafer made according to the present invention has a bending strength of 200 to 600 MPa, such as 200 MPa, 250 MPa, 300 MPa, 350 MPa, 400 MPa, 450 MPa, 500 MPa, 550 MPa, or 600 MPa, and can therefore provide to high mechanical strength.

The method for making an aluminum nitride wafer according to the present invention can make circular aluminum nitride wafers of a diameter of 18 inches, 12 inches, 10 inches, 8 inches, 6 inches, 4.5 inches, 4 inches, 2 inches, or other sizes achievable with current wafer manufacturing technologies. Such an aluminum nitride wafer advantageously features effective insulation, efficient heat dissipation, and a high dielectric constant, and can be used in the electronics industry or the semiconductor industry (e.g., in three-dimensional circuit packaging, power semiconductor device packaging, or circuit manufacture) after the required backend semiconductor processing steps (e.g., masking with a photomask, etching, packaging, and testing).

EXAMPLE

The following examples serve only to enable a person of ordinary skill in the art to understand the essential techniques of the present invention with ease. The present invention can be changed or modified in various ways to adapt to different uses and conditions without departing from the spirit or scope of the present invention; that is to say, the appended claims encompass examples other than those described below.

Preparation Example 1: Preparation of Aluminum Nitride Granules 1 kg aluminum oxide and 1 kg pure aluminum powder were mixed with phenol-formaldehyde resin and carbon powder in a ball mill, before the mixture was granulated. The resulting granules were transferred into a high-temperature furnace into which acetylene, nitrogen, and hydrogen were introduced, and in which high-temperature carbothermic reduction took place at 1 atm and 1600° C. for 20 hours. The granules after the high-temperature carbothermic reduction were placed in an atmospheric environment, subjected to high-temperature decarbonization at 600° C. for 24 hours, and then granulated again with a spray granulator of OHKAWARA to produce 1.1 kg aluminum nitride granules, whose particle sizes ranged from 60 to 90 μm.

Example 1: Method 1 for Making an Aluminum Nitride Wafer 3 kg aluminum nitride granules from preparation example 1 were added and mixed with 10% PVB resin and 1% dispersant to produce an aluminum nitride green body. The aluminum nitride green body was put into a mold in an oil hydraulic press and shaped in vacuum (the pressure in the mold being −0.063 atm) under a molding force of 1961330 N, before isostatic pressing was carried out by a water hydraulic press at 30° C. and 3000 atm to produce an aluminum nitride green-body block. The aluminum nitride green-body block was debinding at 600° C. in an atmospheric environment and subsequently sintered at 10 atm and 1800° C. in a high-temperature furnace of SHIMADZU to form an aluminum nitride wafer block. The aluminum nitride wafer block was transferred to a wheel grinder so as to form an alignment notch in the aluminum nitride wafer block, and after that, the aluminum nitride wafer block was cut with a multi-line cutting machine into 8-inch aluminum nitride wafer slices. Each aluminum nitride wafer slice was wet-lapped on both sides by a bi-directional grinder and then thinned down to the desired thickness by a unidirectional thinning machine. Also, the periphery of each aluminum nitride wafer slice was chamfered by a grinding wheel configured to form the desired peripheral shape, or more particularly a semicircular shape. Each aluminum nitride wafer slice with the desired semicircular chamfered periphery was then dry-polished on both sides by a unidirectional polishing machine to become a finished aluminum nitride wafer.

Example 2: Method 2 for Making an Aluminum Nitride Wafer 3 kg aluminum nitride granules from preparation example 1 were added and mixed with 10% PVB resin and 1% dispersant to produce an aluminum nitride green body. An aluminum nitride green-body slice was then formed by a tape-casting process and was dried at 60° C. for 10 minutes. The dried aluminum nitride green-body slice was debinding at 600° C. in an atmospheric environment and then sintered at 1 atm and 1800° C. in a high-temperature furnace of SHIMADZU to form an aluminum nitride wafer slice, which was subsequently moved to a laser cutting machine in order to form an alignment notch in the periphery of the aluminum nitride wafer slice and cut the aluminum nitride wafer slice into an 8-inch circle. The resulting aluminum nitride wafer slice was wet-lapped on both sides by a bi-directional grinder and then thinned down to the desired thickness by a unidirectional thinning machine. Also, the periphery of the aluminum nitride wafer slice was chamfered by a grinding wheel configured to form the desired peripheral shape, or more particularly a semicircular shape, and once the semicircular chamfered periphery was formed, the aluminum nitride wafer slice was dry-polished on both sides by a unidirectional polishing machine to become a finished aluminum nitride wafer.

Testing Example: Performance Test

A performance test was conducted on the aluminum nitride wafers made in examples 1 and 2, the silicon wafers in comparative example 1, the aluminum oxide wafers in comparative example 2, and the glass wafers in comparative example 3. The test items included thermal conductivity, bending strength, and dielectric constant.

Referring to the test results in Table 1, the aluminum nitride wafers in examples 1 and 2 had relatively high thermal conductivities, high bending strengths, high dielectric constants, and therefore better performance than the wafers made of the other materials.

TABLE 1

|  | Example 1 (Aluminum nitride) | Example 2 (Aluminum nitride) | Comparative example 1 (Silicon) | Comparative example 2 (Aluminum oxide) | Comparative example 3 (Glass) |
| --- | --- | --- | --- | --- | --- |
| Thermal conductivity (W/mk) | 170 | 230 | 130 | 30 | 12 |
| Bending strength (Mpa) | 450 | 350 | 200 | 450 | 250 |
| Dielectric constant (at 1 MHz) | 9 | 9 | 7 | 9 | 6 |

In summary of the above, the method disclosed herein for making an aluminum nitride wafer can produce an aluminum nitride wafer that not only is resistant to corrosion and high heat, but also has a low coefficient of thermal expansion, a high dielectric constant, and high mechanical strength. In addition, the aluminum nitride wafer of the present invention has an alignment notch or a flat alignment edge for preventing problems associated with poor alignment, such as excessively oblique slicing, failure to achieve a flat and even wafer surface by lapping and polishing, and a high fraction defective.

The above is the detailed description of the present invention. However, the above is merely the preferred embodiment of the present invention and cannot be the limitation to the implement scope of the invention, which means the variation and modification according to the present invention may still fall into the scope of the present invention.

What is claimed is:

1. A method for making an aluminum nitride wafer, comprising the steps of:
   (a) subjecting an aluminum nitride green-body block to a high-temperature treatment and thereby turning the aluminum nitride green-body block into an aluminum nitride wafer block;
   (b) forming at least one alignment notch in or at least one flat alignment edge on a periphery of the aluminum nitride wafer block, and cutting the aluminum nitride wafer block into a plurality of aluminum nitride wafer slices; and
   (c) lapping and polishing each of the aluminum nitride wafer slice.

2. The method of claim 1, wherein the aluminum nitride green-body block is obtained by placing an aluminum nitride green-body into a mold, shaping the aluminum nitride green-body in a mechanical or hydraulic manner, and performing an isostatic pressing process with water pressure, oil pressure, or gas pressure; wherein, the mechanical or hydraulic manner is performed at a molding force of 98066.50 to 9806650.00 N, a pressure in the mold is −0.063 to 100 atm, and the water, oil, or gas pressure-based isostatic pressing process uses a pressure of 100 to 8000 atm and a temperature of 10° C. to 100° C.

3. The method of claim 1, wherein the high-temperature treatment includes a debinding process and a sintering process; wherein, the debinding process is performed at a temperature of 200° C. to 900° C. in an environment that contains hydrogen, nitrogen, oxygen, argon, or air; and the sintering process is conducted at a temperature of 1000° C. to 3000° C. under a vacuum-pressure, atmospheric-pressure, or a high-pressure, and in an environment that contains hydrogen, nitrogen, or argon.

4. The method of claim 2, wherein the aluminum nitride green body includes aluminum nitride granules; wherein, the aluminum nitride granules are obtained by mixing aluminum oxide and/or pure aluminum powder with an organic adhesive that contains nitrogen, carbon, and hydrogen atoms; subjecting the mixture to high-temperature carbothermic reduction in a gaseous environment containing nitrogen, carbon, and hydrogen atoms; performing high-temperature decarbonization in a nitrogen atmosphere, an oxygen atmosphere, or an atmospheric gaseous environment; and performing granulation.

5. The method of claim 4, wherein the high-temperature carbothermic reduction is completed at a temperature of 600° C. to 3000° C.

6. The method of claim 1, wherein the step (c) further includes chamfering a periphery of the aluminum nitride wafer slice before or after the aluminum nitride wafer slice is lapped and polished; wherein, a shape of a chamfered periphery includes a rectangular shape, a semicircular shape, an asymmetric semicircular shape, a semielliptical shape, an asymmetric semielliptical shape, a symmetric trapezoidal shape, an asymmetric trapezoidal shape, a shape incorporating a semicircle into a symmetric trapezoid, and a shape incorporating a semicircle into an asymmetric trapezoid.

7. The method of claim 1, wherein the alignment notch is a V-shaped groove, and its pointed V-shaped bottom as well as its left and right upper portions are curved.

8. The method of claim 1, wherein the flat alignment edge is formed by laser, a water jet cutter, or mechanical processing.

9. The aluminum nitride wafer obtained using the method of claim 1, wherein a periphery of the aluminum nitride wafer includes at least one alignment notch or at least one flat alignment edge.

10. A method for making an aluminum nitride wafer, comprising the steps of:
(a) providing an aluminum nitride green-body slice, which can be obtained either by subjecting an aluminum nitride green-body to a tape-casting process, or by first subjecting the aluminum nitride green-body to a tape-casting process to form an aluminum nitride green-body roll and then cutting the aluminum nitride green-body roll;
(b) subjecting the aluminum nitride green-body slice to a high-temperature treatment such that the aluminum nitride green-body slice is turned into an aluminum nitride wafer slice; and
(c) forming at least one alignment notch in or at least one flat alignment edge on a periphery of the aluminum nitride wafer slice, and then lapping and polishing the aluminum nitride wafer slice.

11. The method of claim 10, wherein the high-temperature treatment includes a debinding process and a sintering process; wherein, the debinding process is performed at a temperature of 200° C. to 900° C. in an environment that contains hydrogen, nitrogen, oxygen, argon, or air; and the sintering process is conducted at a temperature of 1000° C. to 3000° C. under a vacuum-pressure, atmospheric-pressure, or a high-pressure, and in an environment that contains hydrogen, nitrogen, or argon.

12. The method of claim 10, wherein the aluminum nitride green body includes aluminum nitride granules; wherein, the aluminum nitride granules are obtained by mixing aluminum oxide and/or pure aluminum powder with an organic adhesive that contains nitrogen, carbon, and hydrogen atoms; subjecting the mixture to high-temperature carbothermic reduction in a gaseous environment containing nitrogen, carbon, and hydrogen atoms; performing high-temperature decarbonization in a nitrogen atmosphere, an oxygen atmosphere, or an atmospheric gaseous environment; and performing granulation.

13. The method of claim 12, wherein the high-temperature carbothermic reduction is completed at a temperature of 600° C. to 3000° C.

14. The method of claim 10, wherein the step (c) further includes chamfering a periphery of the aluminum nitride wafer slice before or after the aluminum nitride wafer slice is lapped and polished; wherein, a shape of a chamfered periphery includes a rectangular shape, a semicircular shape, an asymmetric semicircular shape, a semielliptical shape, an asymmetric semielliptical shape, a symmetric trapezoidal shape, an asymmetric trapezoidal shape, a shape incorporating a semicircle into a symmetric trapezoid, and a shape incorporating a semicircle into an asymmetric trapezoid.

15. The method of claim 10, wherein the alignment notch is a V-shaped groove, and its pointed V-shaped bottom as well as its left and right upper portions are curved.

16. The method of claim 10, wherein the flat alignment edge is formed by laser, a water jet cutter, or mechanical processing.

17. The aluminum nitride wafer obtained using the method of claim 10, wherein a periphery of the aluminum nitride wafer includes at least one alignment notch or at least one flat alignment edge.

* * * * *